US008902686B2

(12) United States Patent
Jeong et al.

(10) Patent No.: US 8,902,686 B2
(45) Date of Patent: Dec. 2, 2014

(54) MEMORY DEVICE, OPERATION METHOD THEREOF, AND MEMORY SYSTEM HAVING THE SAME

(71) Applicant: Samsung Electronics Co., Ltd., Suwon-si (KR)

(72) Inventors: In Chul Jeong, Suwon-si (KR); Ki Heung Kim, Suwon-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 81 days.

(21) Appl. No.: 13/833,195

(22) Filed: Mar. 15, 2013

(65) Prior Publication Data
US 2013/0336076 A1  Dec. 19, 2013

(30) Foreign Application Priority Data

Jun. 14, 2012  (KR) .................. 10-2012-0063917

(51) Int. Cl.
*G11C 7/00* (2006.01)
*G11C 29/04* (2006.01)
*G11C 29/00* (2006.01)

(52) U.S. Cl.
CPC .............. *G11C 29/04* (2013.01); *G11C 29/808* (2013.01); *G11C 29/702* (2013.01)
USPC .................. 365/200; 365/230.03; 365/230.06

(58) Field of Classification Search
CPC ..... G11C 29/04; G11C 29/702; G11C 29/808
USPC ................................ 365/200, 230.03, 230.06
See application file for complete search history.

(56) References Cited

U.S. PATENT DOCUMENTS

| 5,544,113 | A | | 8/1996 | Kirihata et al. | |
|---|---|---|---|---|---|
| 5,652,725 | A | * | 7/1997 | Suma et al. | 365/200 |
| 5,748,543 | A | * | 5/1998 | Lee et al. | 365/200 |
| 5,781,484 | A | * | 7/1998 | Tanaka et al. | 365/200 |
| 5,798,974 | A | * | 8/1998 | Yamagata | 365/200 |
| 5,894,441 | A | * | 4/1999 | Nakazawa | 365/200 |
| 6,233,181 | B1 | * | 5/2001 | Hidaka | 365/200 |
| 6,728,149 | B2 | * | 4/2004 | Akamatsu | 365/200 |
| 7,460,420 | B2 | * | 12/2008 | Sunaga | 365/200 |
| 2008/0266990 | A1 | * | 10/2008 | Loeffler | 365/201 |
| 2013/0262740 | A1 | * | 10/2013 | Kim et al. | 711/102 |

FOREIGN PATENT DOCUMENTS

| KR | 1994-0012406 | 6/1994 |
|---|---|---|
| KR | 10-0172349 B1 | 10/1998 |
| KR | 2002-0084947 A | 11/2002 |
| WO | WO 2005-081260 A1 | 9/2005 |

* cited by examiner

*Primary Examiner* — Viet Q Nguyen
(74) *Attorney, Agent, or Firm* — Muir Patent Consulting, PLLC

(57) ABSTRACT

A method of repairing a word line of a memory device includes receiving a row address, comparing a received row address with a row address of a defective cell, enabling a normal word line and a redundant word line, which correspond to the row address, according to a result of the row address comparison, receiving a column address, comparing a received column address with a column address of the defective cell, and performing a memory access operation on one of the normal word line and the redundant word line according to a result of the column address comparison.

20 Claims, 14 Drawing Sheets

MEMORY DEVICE, OPERATION METHOD THEREOF, AND MEMORY SYSTEM HAVING THE SAME

CROSS-REFERENCE TO RELATED APPLICATIONS

This application claims priority under 35 U.S.C. §119 from Korean Patent Application No. 10-2012-0063917 filed on Jun. 14, 2012, the disclosure of which is hereby incorporated by reference in its entirety.

BACKGROUND

Embodiments disclosed herein relate to an operation method of a memory device, and more particularly, to a method of repairing a plurality of word lines by using redundant word lines and devices using the same.

In general, when a defect occurs in a memory cell, a semiconductor chip is equipped with a redundant memory block to replace the memory cell.

When a memory access operation is performed on a defective cell where a defect occurs, the defective cell may be repaired by being replaced with a redundant memory cell included in a redundant memory block.

When a normal word line includes a defective cell, all of the normal word line may be replaced with a redundant word line included in the redundant memory block. In this case, a normal word line may be repaired with a redundant word line and normal memory cells included in the normal word line may not be used, thereby lowering efficiency of repair.

SUMMARY

One embodiment is directed to a method of repairing a word line of a memory device, including receiving a row address, comparing a received row address with a row address of a defective cell, enabling a normal word line and a redundant word line together which correspond to the row address according to a result of the row address comparison, receiving a column address, comparing the received column address with a column address of the defective cell, and performing a memory access operation on one of the normal word line and the redundant word line according to a result of column address comparison.

According to one example embodiment, the method includes enabling the normal word line and the redundant word line, which correspond to the row address, when the row address comparison results in the received row address matching the row address of the defective cell.

According to an example embodiment, the method further includes performing the memory access operation on the redundant word line when the received column address accords with the column address of the defective cell, and performing the memory access operation on the normal word line when the received column address does not accord with the column address of the defective cell.

According to an example embodiment, the redundant word line may include a plurality of redundant word line segments, and each of the plurality of redundant word lines segments is used to repair a particular normal word line corresponding to the word line segment. A first word line segment of the plurality of redundant word line segments may be used to repair a set of defective cells of a first normal word line; and a second word line segment of the plurality of redundant word line segments may be used to repair a set of defective cells of a second normal word line.

According to one embodiment, comparing the received column address with a column address of the defective cell includes comparing the received column address with a column address of a defective cell included in the enabled normal word line corresponding to the received row address.

According to an example embodiment, the memory access operation is a read operation, and performing the memory access operation includes selecting one of the normal word line and the redundant word line when a sense amplifier enable signal for sensing and amplifying data output through a local data line corresponding to the column address is activated, and performing the memory access operation according to a result of selection.

According to an example embodiment, the memory access operation is a write operation, and performing the memory access operation includes selecting one of the normal word line and the redundant word line when a write MUX signal for transmitting data to a local data line corresponding to the column address is activated, and performing the memory access operation according to a result of selection.

In one embodiment, a method of operating a memory device includes: receiving a row address and comparing the received row address with a row address of a defective memory cell; concurrently enabling a normal word line and a redundant word line for the normal word line based on the row address, when the received row address matches the row address of the defective memory cell; receiving a column address and comparing the received column address with a column address of the defective memory cell or a range of column addresses associated with the defective memory cell; selecting either the normal word line or the redundant word line according to a result of the column address comparison; and performing a memory access operation on the selected word line.

In one embodiment, the row address of the defective memory cell is stored in a one time programmable memory.

In one embodiment, comparing the received column address with a column address of the defective cell or range of column addresses associated with the defective memory cell includes comparing the received column address with a column address of a defective cell, or a range of column addresses associated with the defective memory cell, included in the enabled normal word line corresponding to the received row address.

In one embodiment, performing the memory access operation includes performing the memory access operation on the redundant word line when the received column address accords with the column address of the defective cell or a range of column addresses associated with the defective memory cell, and performing the memory access operation on the normal word line when the received column address does not accord with either the column address of the defective cell or the range of column addresses associated with the defective memory cell.

In one embodiment, the redundant word line includes a plurality of redundant word line segments, and each word line segment of the plurality of redundant word line segments is used to repair a set of defective cells of particular normal word line corresponding to the word line segment. A first word line segment of the plurality of redundant word line segments may be used to repair a set of defective cells of a first normal word line; and a second word line segment of the plurality of redundant word line segments may be used to repair a set of defective cells of a second normal word line.

Another exemplary embodiment is directed to a memory device, including a memory cell array including a plurality of normal word lines and a plurality of redundant word lines; a row access circuit configured to receive a row address, compare a received row address with a row address of a defective cell, and enable both a normal word line corresponding to the row address among the plurality of normal word lines and a redundant word line corresponding to the row address among the plurality of redundant word lines according to a result of comparison; a column address comparing circuit configured to receive a column address, compare a received column address with a column address of the defective cell, and generate a comparison signal according to a result of comparison; and a selection circuit configured to select one of the normal word line and the redundant word line to perform a memory access operation based on the comparison signal.

An example embodiment is directed to a memory system, including the memory device, and a memory controller for generating the row address and the column address.

According to an example embodiment, the redundant word line may repair at least two normal word lines among the plurality of normal word lines. According to an example embodiment, the redundant word line may include a plurality of redundant word line segments, and each of the plurality of redundant word line segments may repair a normal word line corresponding to each of the plurality of redundant word line segments. According to an example embodiment, the row access circuit may include a first one-time programmable (OTP) memory for storing the row address of the defective cell, and the column address comparing circuit may include a second one-time programmable (OTP) memory for storing the column address of the defective cell.

According to an example embodiment, the memory device may be a dynamic random access memory (DRAM).

DETAILED DESCRIPTION

Figure 1:
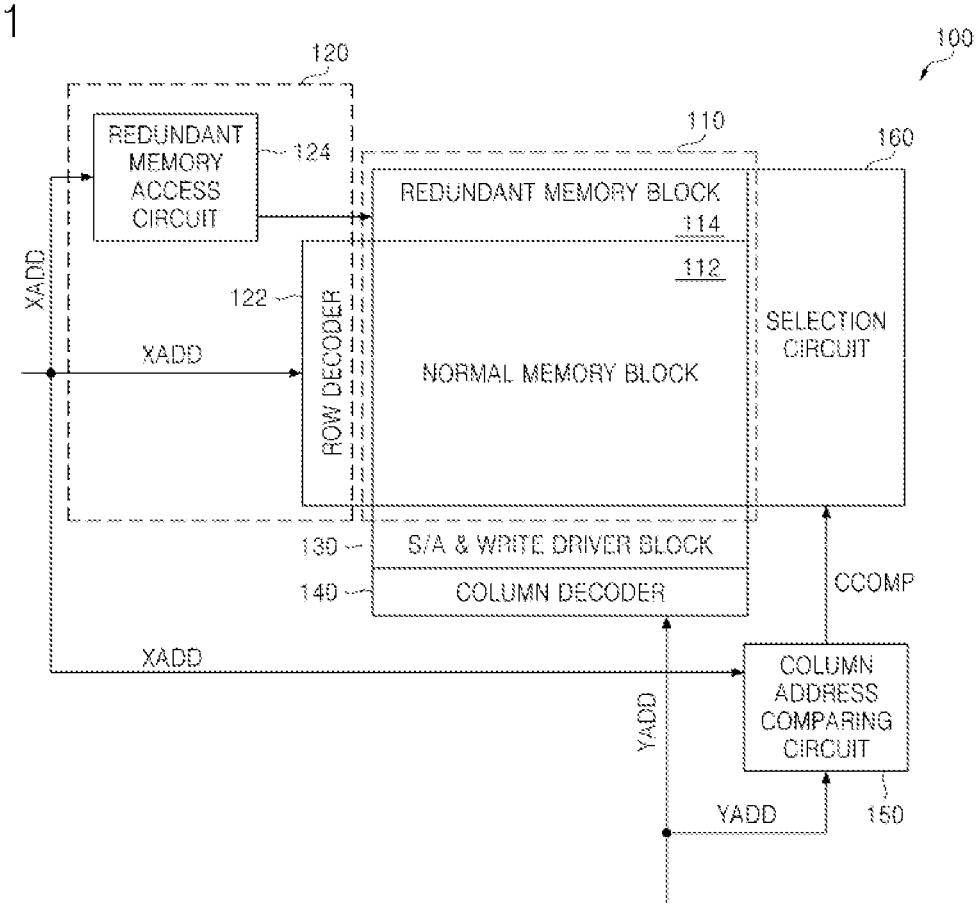
FIG. 1 is a block diagram of a memory device according to an example embodiment.

FIG. 1 is a block diagram of a memory device according to an example embodiment. Referring to FIG. 1, a memory device 100 may be embodied in a dynamic random access memory (DRAM); however, it is not restricted thereto. The memory device 100 may be a semiconductor chip, a semiconductor package including one or more semiconductor chips, or a package-on-package device including a plurality of semiconductor packages, for example.

In one embodiment, the memory device 100 includes a memory cell array 110, a row access circuit 120, a sense amplifiers & write driver block 130, a column decoder 140, a column address comparing circuit 150, and a selection circuit 160.

The memory cell array 110 may include a normal memory block 112 and a redundant memory block 114. The normal memory block 112 may include a plurality of normal word lines (not shown) and normal memory cells (not shown) connected to each of the plurality of normal word lines. The normal memory cells are generally used as a default for memory access operations, so long as they are not defective. The redundant memory block 114 may include a plurality of redundant word lines (not shown) and a plurality of redundant memory cells (not shown) for repairing defective cells where a defect occurs among the normal memory cells (not shown).

The row access circuit 120 may include a row decoder 122 and a redundant memory access circuit 124. The row decoder 122 may receive a row address and decode a received row address XADD. According to an example embodiment, the row address XADD may be transmitted from a memory controller (not shown) for controlling the memory device 100.

The memory device 100 may further include a row driver (not shown) for enabling a normal word line corresponding to a row address XADD based on a decoded row address XADD.

The redundant memory access circuit 124 may receive a row address XADD and determine whether there is a defective cell included in a normal word line corresponding to a received row address XADD. The redundant memory access circuit 124 may enable a redundant word line (not shown) corresponding to a row address XADD according to a result of determination. According to an example embodiment, the memory device 100 may further include a row decoder (not shown) for enabling a redundant word line included in the redundant memory block 114 and/or a row driver (not shown).

The sense amplifiers & write driver block 130 may operate as a sense amplifier sensing and amplifying a voltage change of each bit line when the memory device 100 performs a read operation. The sense amplifiers & write driver block 130 may operate as a write driver driving each of a plurality of bit lines included in the memory cell array 110 when the memory device 100 performs a write operation. For convenience's sake in the description, FIG. 1 describes that the sense amplifiers & write driver block 130 may operate as a sense amplifier or write driver of memory cell array 110. But, each of redundant memory block 114 and normal memory block 112 may have separate sense amplifiers & write driver block and the inventive concept is not restricted to the embodiments described herein.

The column decoder 140 may receive a column address YADD and decode a received column address YADD. According to an example embodiment, a column address YADD may be transmitted from a memory controller (not shown) for controlling the memory device 100.

The column address comparing circuit 150 may receive a column address YADD and row address XADD. The column address comparing circuit 150 may then compare if a received column address YADD accords with a column address of a defective cell included in enabled word line corresponding to the row address XADD. The column address comparing circuit 150 may generate a comparison signal CCOMP according to a result of comparison.

The selection circuit 160 may receive a comparison signal CCOMP transmitted from the column address comparing circuit 150 and select one of an enabled normal word line and an enabled redundant word line to perform a memory access operation based on a received comparison signal CCOMP. According to an example embodiment, the selection circuit 160 may select one of the enabled normal word line and the enabled redundant word line by controlling a switch (not shown) connected between normal memory cell included in the enabled normal word line and global I/O (input/output) line (not shown) and a switch (not shown) connected between redundant memory cell included in the enabled redundant word line and the global I/O line. The global I/O line may refer to a common data path of the normal memory cell and the redundant memory cell. According to one example embodiment, the selection circuit 160 may execute the selection when a signal for enabling the sense amplifiers & write driver block 130 is activated.

For example, in case of the memory device 100 performing a read operation, the selection may be executed when a sense amplifier enable signal is activated. The sense amplifier enable signal may refer to a signal for sensing and amplifying data output through a local data line (not shown) corresponding to a column address YADD. For example, in case of the memory device 100 performing a write operation, the selection may be executed when a write multiplexer (MUX) enable signal is activated. The write MUX enable signal may refer to a signal for transmitting data to a local data line (not shown) corresponding to a column address YADD.

Figure 2:
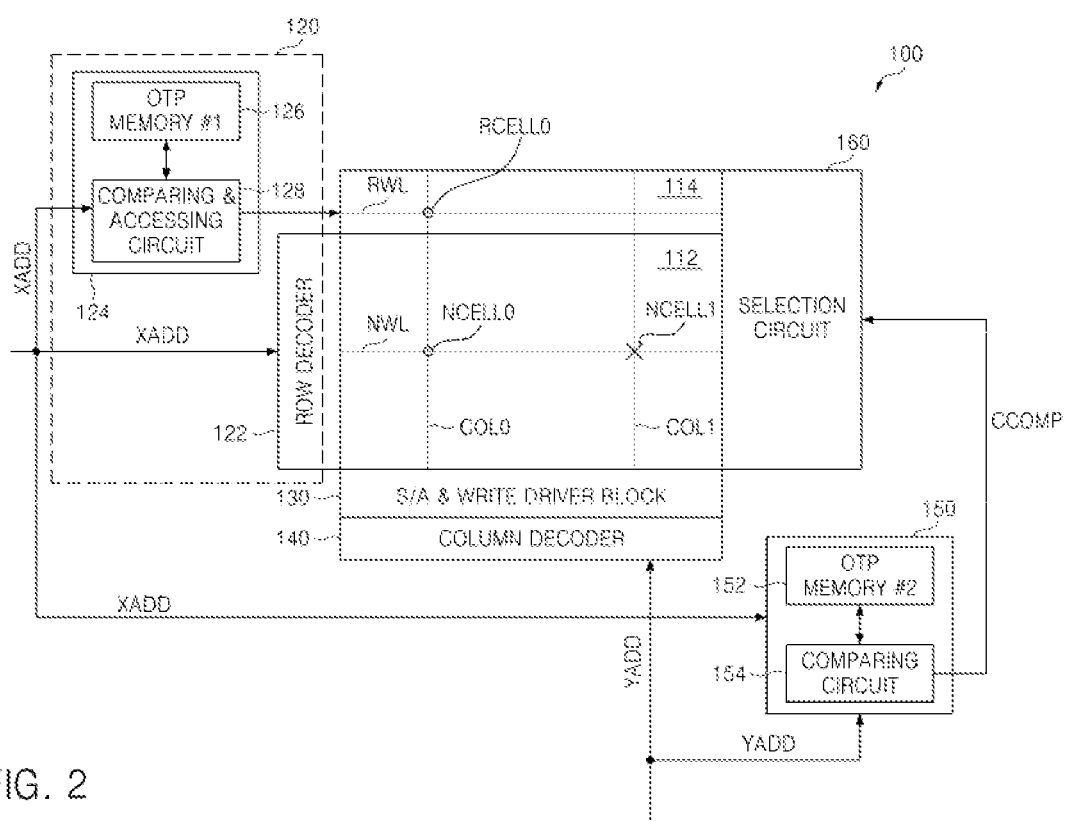
FIG. 2 is a drawing for explaining a memory access operation according to an example embodiment of the memory device illustrated in FIG. 1.

FIG. 2 is a drawing for explaining a memory access operation according to an example embodiment of the memory device illustrated in FIG. 1. Referring to FIG. 2, a memory access operation may be performed on a normal memory cell NCELL0. It is assumed that the normal memory cell NCELL0 is not defective and a normal memory cell NCELL1 is a defective cell having a defect.

The redundant memory access circuit 124 may include a first one-time programmable (OTP) memory 126 and a comparing & accessing circuit 128.

The first OTP memory 126 may store a row address for any rows that include defective cells. Therefore, each of defective cells, e.g., NCELL1, included in the normal memory block 112 will be associated with a row address stored in the first OTP memory 126. According to an example embodiment, the first OTP memory 126 may be embodied using a fuse, an anti-fuse, or a laser fuse; however, it is not restricted thereto.

When a received row address XADD accords with a row address of a defective cell, e.g., NCELL1, included in the normal memory block 112, the comparing & accessing circuit 128 may enable a redundant word line, e.g., RWL, corresponding to the row address XADD. According to an example embodiment, the memory device 100 may further include a row decoder (not shown) and/or a row driver (not shown) for enabling a redundant word line included in the redundant memory block 114 inside or outside the comparing & accessing circuit 128.

When the memory device 100 performs a memory access operation on a normal memory cell NCELL0, the row decoder 122 may enable a normal word line NWL corresponding to a row address XADD. In addition, since the row address XADD of the normal memory cell NCELL0 accords with a row address of a defective cell, e.g., NCELL1, the comparing & accessing circuit 128 may enable a redundant word line RWL corresponding to the row address XADD. As such, both a normal word line NWL and a redundant word line RWL may be enabled concurrently together when a memory device 100 performs a memory access operation for a row that includes a defective memory cell.

The column address comparing circuit 150 may include a second OTP memory 152 and a comparing circuit 154. The second OTP memory 152 may store a column address and row address of each of the defective cells, e.g., NCELL1, included in the normal memory block 112. According to an example embodiment, the second OTP memory 152 may be embodied using a fuse, an anti-fuse, or a laser fuse; however, it is not restricted thereto.

The comparing circuit 154 may compare a received column address XADD with a column address of a defective cell included in an enabled normal word line NWL corresponding to the row address XADD, and may generate a comparison signal at different levels according to a result of the comparison. For example, when the column address XADD accords with a column address of the defective cell, the comparing circuit 154 may generate a comparison signal CCOMP at a high level, e.g., '1'; otherwise, the comparing circuit 154 may generate a comparison signal CCOMP at a low level, e.g., '0'.

When the memory device 100 performs a memory access operation on a normal memory cell NCELL0, a column address COL0 of the normal memory cell NCELL0 does not match any column address of a defective cell in the row that includes NCELL0. In this case, the column address comparing circuit 150 may generate a comparison signal CCOMP at a low level, .e.g., 0.

In one embodiment, the selection circuit 160 selects one, of the normal word line NWL and the redundant word line RWL which are enabled together (e.g., in one example, selects the NWL), in response to a comparison signal CCOMP at a specific level, a low level (e.g., in the example above, '1'), by turning on a switch (not shown) connected between normal memory cell NCELL0 included in enabled normal word line NWL and global I/O line and turning off a switch (not shown) connected between the redundant memory cell RCELL0 included in enabled redundant word line RWL and the global I/O line. Then the memory device 100 may perform a memory access operation on the selected normal word line NWL. As such, although the normal word line NWL includes a defective cell, e.g., NCELL1, a normal memory cell NCELL0 which is not defective among the normal word line NWL may be used.

Figure 3:
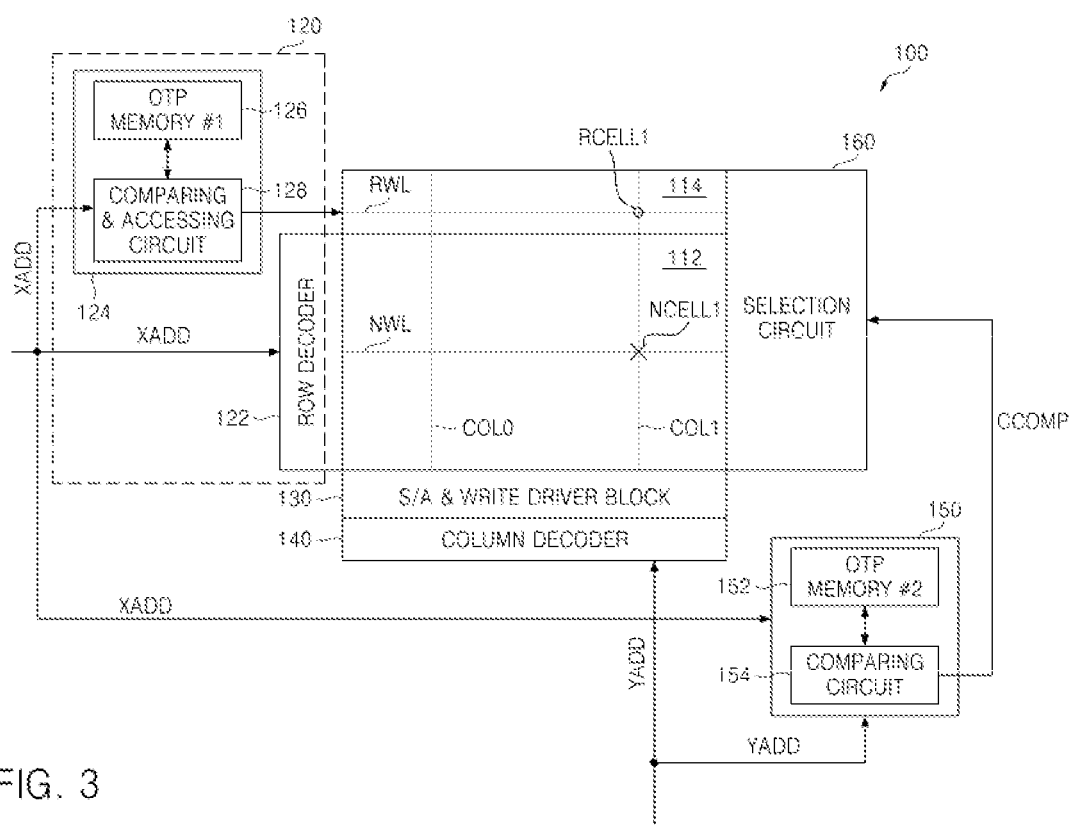
FIG. 3 is a drawing for explaining the memory access operation according to another example embodiment of the memory device illustrated in FIG. 1.

FIG. 3 is a drawing for explaining the memory access operation according to another example embodiment of the memory device illustrated in FIG. 1. Referring to FIG. 3, in one embodiment, a memory access operation is performed on a normal memory cell NCELL1. It is assumed that the normal memory cell NCELL1 is a defective cell having a defect.

When the memory device 100 performs a memory access operation on the normal memory cell NCELL1, the row decoder 122 may enable a normal word line NWL corresponding to a row address XADD.

In addition, since a row address XADD of the normal memory cell NCELL1 accords with a row address of a defective cell, e.g., NCELL1, the comparing & accessing circuit 128 enables a redundant word line RWL corresponding to the row address XADD. As a result, both a normal word line NWL and a redundant word line RWL are enabled concurrently together.

When the memory device 100 performs a memory access operation on a normal memory cell NCELL1, a column address, e.g., COL1, of the normal memory cell NCELL1 accords with a column address, e.g., COL1, of a defective cell, e.g., NCELL1, included in the enabled word line NWL corresponding to the row address XADD. As a result, the column address comparing circuit 150 generates a comparison signal CCOMP at a specific level, e.g., a high level.

In one embodiment, the selection circuit 160 selects one of a normal word line NWL and a redundant word line RWL, e.g., in this case a redundant word line RWL, in response to a comparison signal CCOMP at a specific level, e.g., a high level, by turning off a switch (not shown) connected between normal memory cell NCELL1 included in enabled normal word line NWL and global I/O line and turning on a switch (not shown) connected between the redundant memory cell RCELL1 included in enabled redundant word line RWL and the global I/O line. The memory device 100 may then perform a memory access operation on the selected redundant word line RWL.

In this case, the memory device 100 performs a memory access operation on a redundant memory cell RCELL1 having a column address the same as a column address, e.g., COL1, of a defective cell, e.g., NCELL1, among redundant memory cells connected to the redundant word line RWL.

Referring to FIGS. 2 and 3, although the normal word line includes a defective cell, e.g., NCELL1, the memory device 100 of the above-disclosed embodiments may repair a defective cell, e.g., NCELL1, with a redundant memory cell, e.g., RCELL1, while using a normal memory cell, e.g. NCELL0, which is not defective among the normal word line NWL, as it is.

Figure 4:
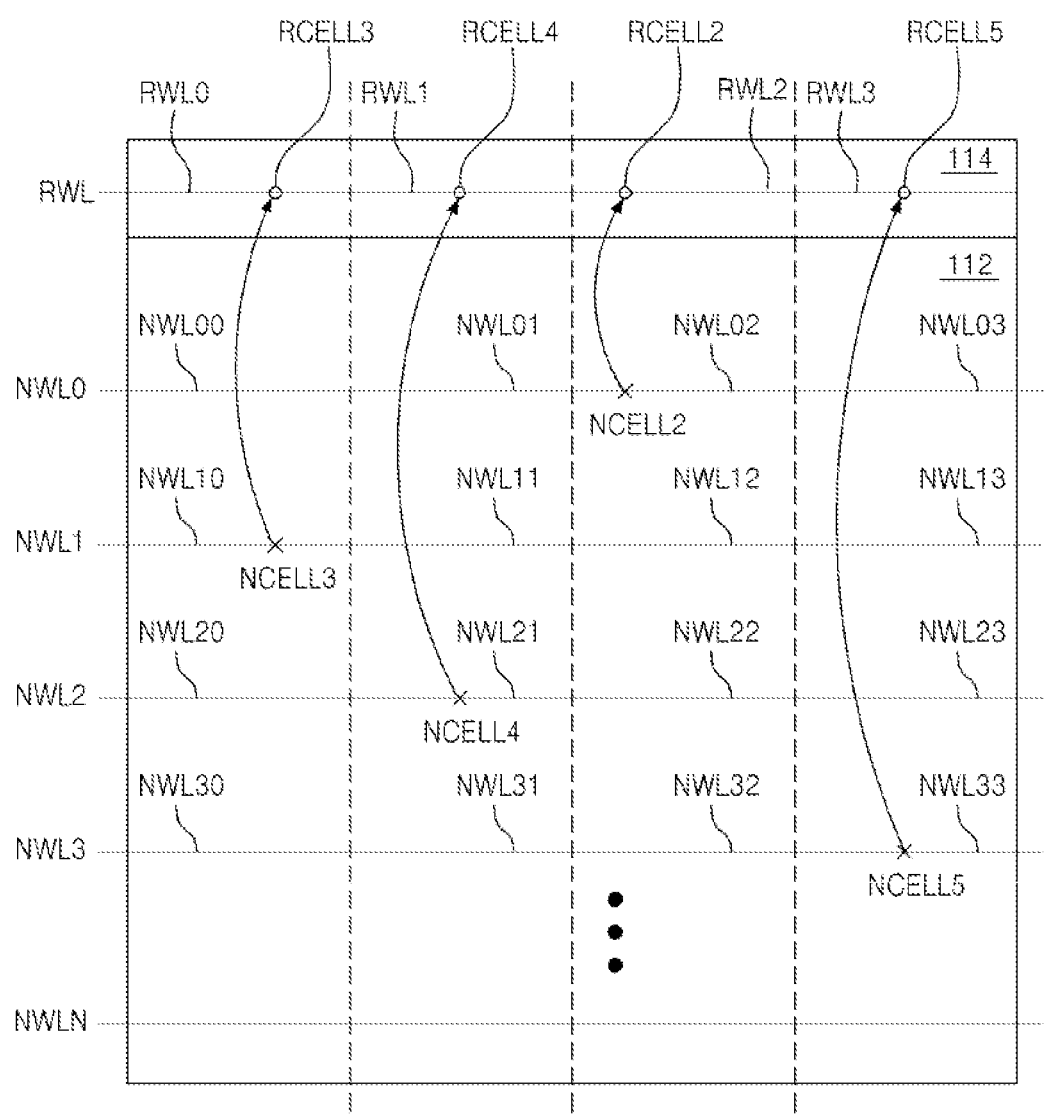
FIG. 4 is a drawing for explaining an example embodiment of a method of repairing defective cells of a memory cell array illustrated in FIG. 1.

FIG. 4 is a drawing for explaining an example embodiment of a method of repairing defective cells of the memory cell array illustrated in FIG. 1. Referring to FIGS. 1 and 4, a redundant word line RWL may be divided into a plurality of redundant word line segments RWL0 through RWL3 according to a column address. The division may mean that the redundant word line RWL may be conceptually divided. For example, the redundant word line RWL may be divided based on column address, and redundant memory cells which have column address in certain range may included in each redundant word line segments RWL0 to RWL3.

Each of the redundant word line segments RWL0 through RWL3 may repair a normal word line NWL0 through NWLN corresponding to each of the redundant word line segments RWL0 through RWL3.

A redundant word line segment RWL0 may repair a normal word line NWL1 corresponding to the redundant word line segment RWL0. For example, a redundant word line segment RWL0 includes a redundant memory cell RCELL3, which may repair a defective cell, e.g., NCELL3, included in a normal word line NWL1.

A redundant word line segment RWL1 may repair a normal word line NWL2 corresponding to the redundant word line segment RWL1. For example, a redundant word line segment RWL1 includes a redundant memory cell RCELL4, which may repair a defective cell, e.g., NCELL4, included in a normal word line NWL2.

A redundant word line segment RWL2 may repair a normal word line NWL0 corresponding to the redundant word line segment RWL2. For example, a redundant word line segment RWL2 includes a redundant memory cell RCELL2 which may repair a defective cell, e.g., NCELL2, included in a normal word line NWL0.

A redundant word line segment RWL3 may repair a normal word line NWL3 corresponding to the redundant word line segment RWL3. For example, a redundant word line segment RWL3 includes a redundant memory cell RCELL5, which may repair a defective cell, e.g., NCELL5, included in a normal word line NWL3.

Non-defective parts NWL00, NWL01 and NWL03 of the normal word line NWL0 are used as they are, and a defective part NWL02 may be repaired by using a redundant word line segment RWL2.

Non-defective parts NWL11 through NWL13 of the normal word line NWL1 are used as they are, and a defective part NWL10 may be repaired by using a redundant word line segment RWL0. Non-defective parts NWL20, NWL22, and NWL23 of the normal word line NWL2 are used as they are, and a defective part NWL21 may be repaired by using a redundant word line segment RWL1.

Non-defective parts NWL30 through NWL32 of the normal word line NWL3 are used as they are, and a defective part NWL33 may be repaired by using a redundant word line segment RWL3.

Accordingly, the memory device 100 according to an example embodiment may repair a plurality of normal word lines, e.g., NWL0 through NWL3, with a single redundant word line, e.g., RWL, by using an non-defective part of each of normal word lines, e.g., NWL0 through NWLN, as it is, and repairing only a defective part using a redundant word line segment RWL0 through RWL3. Furthermore, as shown in FIG. 4, a range of columns for a particular word line can be set such that if a column address within that range is received for a particular word line, then the redundant word line associated with that range is selected, and a redundant memory cell associated with the row address and column address is accessed.

The example given above in connection with FIG. 4 is only one example of a mapping of normal word lines to redundant word line segments. This situation may not always be the case. For example, FIG. 4 shows four non-overlapping sections of four normal word lines that are together mapped to a single redundant word line. However, in some situations, more or less of a particular normal word line may include defective cells, such that the range of columns that needs to be mapped to a redundant word line may be greater or less than the ranges shown in FIG. 4. In such cases, a different mapping scheme may be used that uses, for example, different mapping tables to associate a defective range of columns for a particular normal word line to a particular redundant word line and segment of that word line.

Figure 5:
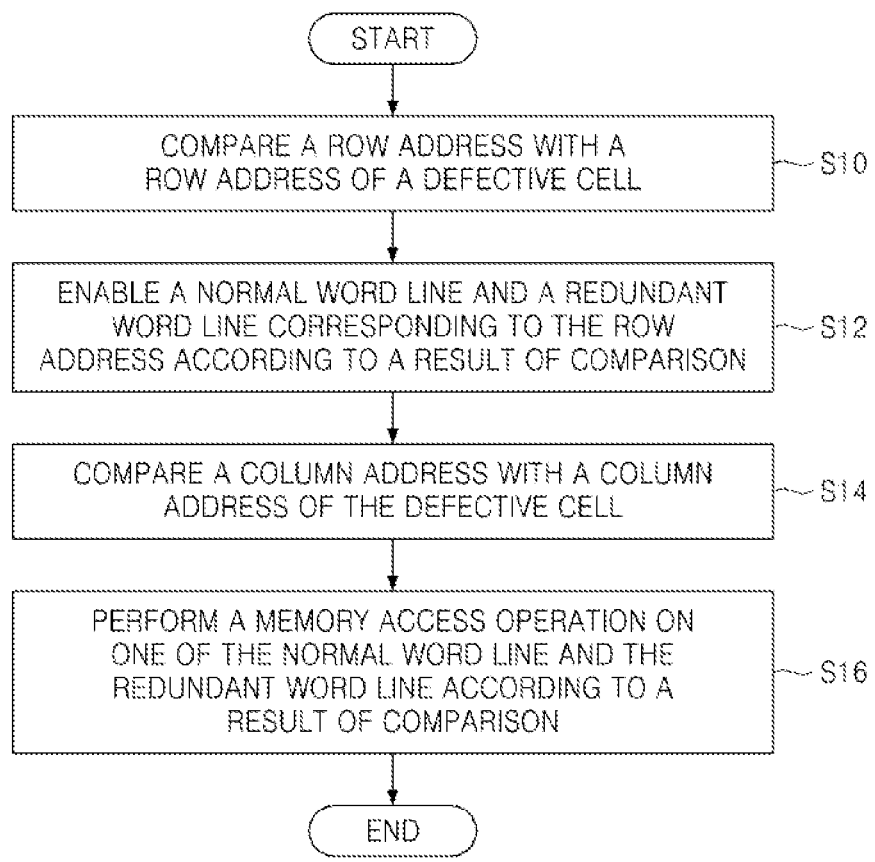
FIG. 5 is a flowchart of an operation method of the memory device according to an example embodiment.

FIG. 5 is a flowchart of an operation method of a memory device according to an example embodiment. Referring to FIGS. 1 through 5, a row access circuit 120 may compare a row address XADD with a row address of a defective cell, e.g., NCELL1 (S10).

The row access circuit 120 may enable a normal word line NWL and a redundant word line RWL, both corresponding to a row address XADD, according to a result of comparison (S12). The column address comparing circuit 150 may compare a column address YADD with a column address, e.g., COL1, of a defective cell, e.g., NCELL1 (S14), for the enabled normal word line NWL corresponding to the row address XADD.

According to an example embodiment, the column address comparing circuit 150 generates a comparison signal CCOMP according to a result of comparison. The selection circuit 160 may select one of an enabled normal word line NWL and an enabled redundant word line RWL to perform a memory access operation based on the comparison signal CCOMP, and the memory device 100 may perform a memory access operation according to a result of selection (S16).

Figure 6:
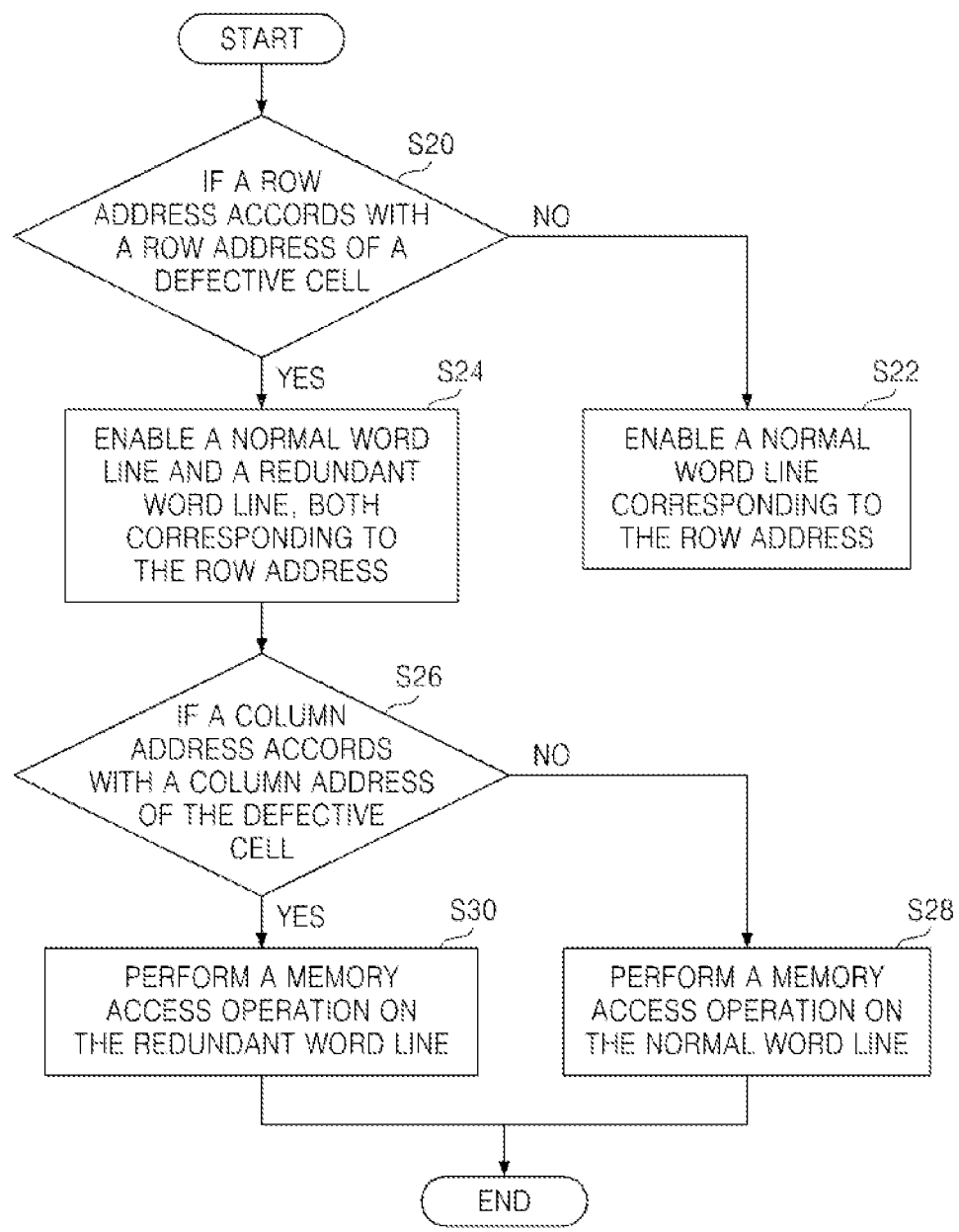
FIG. 6 is a flowchart of the operation method of the memory device according to another example embodiment.

FIG. 6 is a flowchart of an operation method of the memory device according to another example embodiment. Referring to FIGS. 1 through 6, the row access circuit 120 may determine if a row address XADD accords with a row address of a defective cell, e.g., NCELL1 (S20).

When the row address XADD does not accord with a row address of the defective cell according to a result of determination, the row access circuit 120 may enable only a normal word line NWL corresponding to the row address XADD (S22). When the row address XADD accords with the row address of the defective cell according to a result of determination, the row access circuit 120 may enable both a normal word line NWL corresponding to the row address XADD and a redundant word line RWL corresponding to the row address XADD (S24).

The column address comparing circuit 150 may determine if a column address CADD accords with a column address of a defective cell, e.g., NCELL1 (S26), included in the enabled normal word line NWL corresponding to the row address XADD. According to an example embodiment, the column address comparing circuit 150 may generate a comparison signal CCOMP according to a result of comparison.

When the column address CADD does not accord with a column address of a defective cell included in the enabled normal word line NWL corresponding to the row address XADD, the memory device 100 may perform a memory access operation on an enabled normal word line NWL, from among an enabled normal word line NWL and an enabled redundant word line RWL (S28).

When the column address CADD accords with a column address of a defective cell included in the enabled normal word line NWL corresponding to the row address XADD, e.g., NCELL1, the memory device 100 may perform a memory access operation on an enabled redundant word line RWL, from among an enabled normal word line NWL and an enabled redundant word line RWL (S30).

Figure 7:
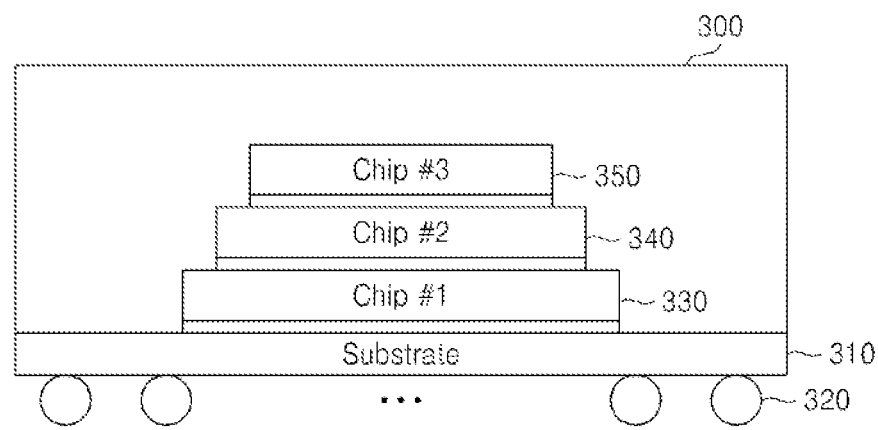
FIG. 7 is a conceptual diagram depicting an example embodiment of a package including the memory device illustrated in FIG. 1.

FIG. 7 is a conceptual diagram depicting an example embodiment of a package including the memory device illustrated in FIG. 1. Referring to FIGS. 1 and 7, a package 300 may include a plurality of semiconductor chips 330, 340 and 350 stacked successively on a package substrate 310. Each of the plurality of semiconductor chips 330 through 350 may be the memory device 100. The package 300 may also be referred to as the memory device 100.

The package 300 may be embodied in Package On Package (PoP), Ball Grid Arrays (BGAs), Chip Scale Packages (CSPs), Plastic Leaded Chip Carrier (PLCC), Plastic Dual In-Line Package (PDIP), Chip On Board (COB), CERamic Dual In-Line Package (CERDIP), Plastic Metric Quad Flat Pack (MQFP), Thin Quad Flat Pack (TQFP), Small-Outline Integrated Circuit (SOIC), Shrink Small Outline Package (SSOP), Thin Small Outline (TSOP), System In Package (SIP), Multi Chip Package (MCP), Wafer-Level Package (WLP), or Wafer-Level Processed Stack Package (WSP).

According to an example embodiment, a memory controller (not shown) may be embodied inside one or more than one semiconductor chip among the plurality of semiconductor chips 330 through 350, or embodied on the package substrate 310.

For an electrical connection between the plurality of semiconductor devices 330 through 350, an electrical vertical connection means, e.g., a through substrate via such as a through-silicon via (TSV), may be used.

The package 300 may be embodied in Hybrid Memory Cube (hereinafter: 'HMC') having a structure such that a memory controller and a memory cell array die are stacked. Performance of the memory device may be improved by an increase in bandwidth caused by an embodiment in HMC, and power consumption and production cost may be reduced by minimizing an area occupied by the memory device.

Figure 8:
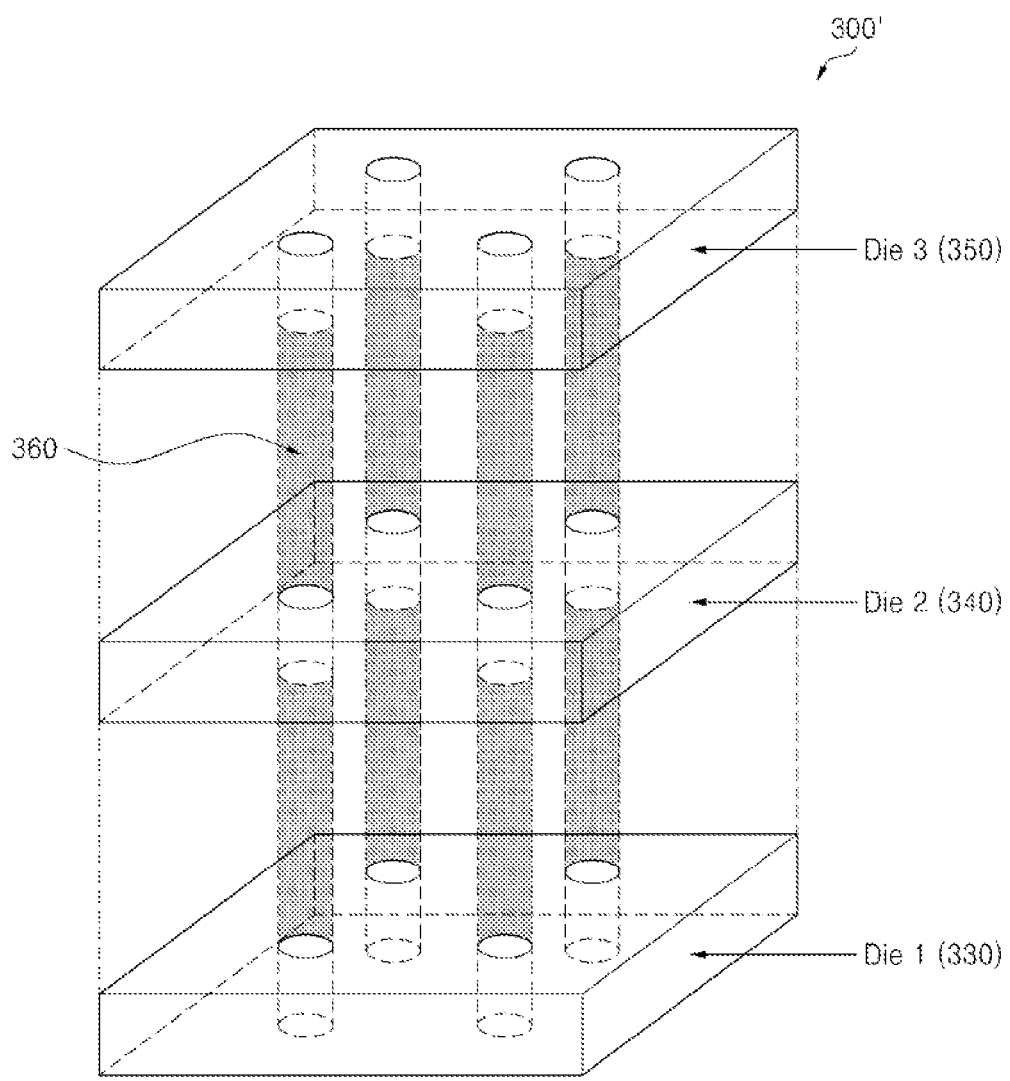
FIG. 8 is a conceptual diagram three-dimensionally depicting an example embodiment of the package including the memory device illustrated in FIG. 1.

FIG. 8 is a conceptual diagram three-dimensionally depicting an example embodiment of a package including the memory device illustrated in FIG. 1. Referring to FIGS. 1, 7 and 8, a package 300' includes a plurality of dies 330 to 350 having a stack structure where each is connected to each other through each TSV 360.

Figure 9:
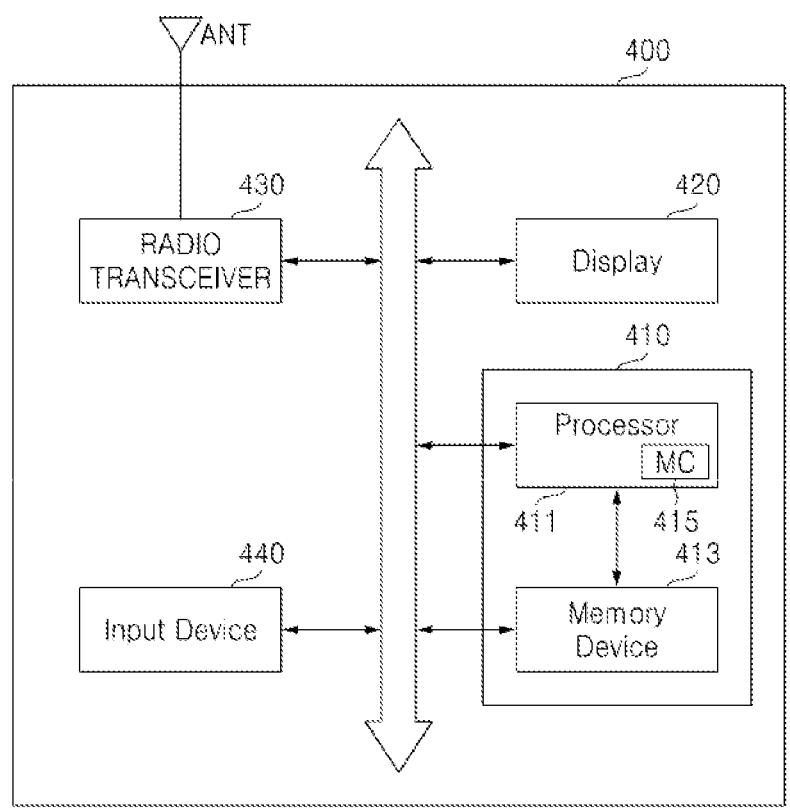
FIG. 9 depicts an example embodiment of a system including the memory device illustrated in FIG. 1.

FIG. 9 is an example embodiment of a system including the memory device illustrated in FIG. 1. Referring to FIGS. 1, and 7 through 9, a system 400 may be embodied in an electronic device or a portable device. The portable device may be embodied in a cellular phone, a smart phone, a tablet PC, or a laptop computer, for example.

The system 400 includes a processor 411 and a memory device 413. The memory device 413 may be the memory device 100 of FIG. 1.

According to an example embodiment, the processor 411 and the memory device 413 may be packaged into a package 410. In this case, the package 410 may be mounted on a system board (not shown). The package 410 may refer to a package 300 illustrated in FIG. 7 or a package 300' illustrated in FIG. 8, for example.

The processor 411 includes a memory controller 415 which may control a data processing operation, e.g., a write operation or a read operation, of the memory device 413. The memory controller 415 may be controlled by the processor 411 controlling an overall operation of the system 400. According to an example embodiment, the memory controller 415 may be connected between the processor 411 and the memory device 413.

Data stored in the memory device 413 may be displayed through a display 420 according to a control of the processor 411.

A radio transceiver 430 may transmit or receive a radio signal through an antenna ANT. For example, the radio transceiver 430 may convert a radio signal received through the antenna ANT into a signal, which may be processed by the processor 411. Accordingly, the processor 411 may process a signal output from the radio transceiver 430, and store a processed signal in the memory device 413 or display a processed signal through the display 420. The radio transceiver 430 may convert a signal output from the processor 411 into a radio signal and output a converted radio signal to outside through the antenna ANT.

An input device 440 is a device which may input a control signal for controlling an operation of the processor 411 or data to be processed by the processor 411, and may be embodied in a pointing device such as a touch pad and a computer mouse, a keypad or a keyboard.

The processor 411 may control the display 420 so that data output from the memory device 413, a radio signal output from the radio transceiver 430, or data output from the input device 440 may be displayed through the display 420.

Figure 10:
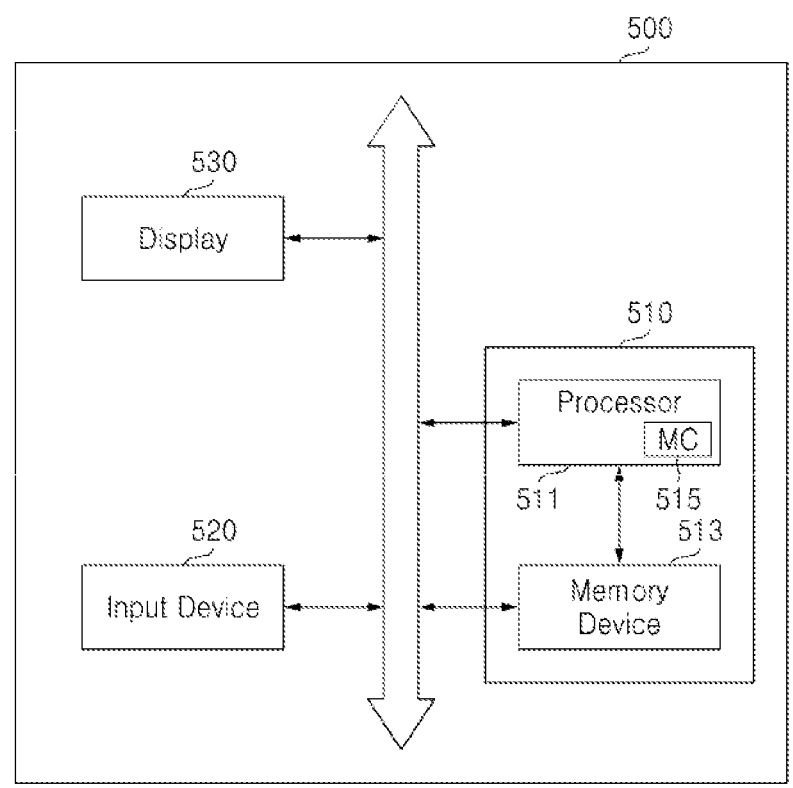
FIG. 10 depicts another example embodiment of the system including the memory device illustrated in FIG. 1.

FIG. 10 is another example embodiment of the system including the memory device illustrated in FIG. 1. Referring to FIGS. 1, 7, 8, and 10, a system 500 may be embodied, for example, in a personal computer (PC), a laptop computer, a tablet PC, a net-book, an e-reader, a personal digital assistant (PDA), a portable multimedia player (PMP), a MP3 player, or a MP4 player.

The system 500 includes a processor 511 for controlling an overall operation of the system 500 and a memory device 513. The memory device 513 may include the memory device 100 illustrated in FIG. 1, for example. According to an example embodiment, the processor 511 and the memory device 513 may be packaged into a package 510. The package 510 may be mounted on a system board (not shown). The package 510 may include the package 300 illustrated in FIG. 7 or the package 300' illustrated in FIG. 8, for example.

The processor 511 may include a memory controller 515 controlling an operation of the memory device 513. The processor 511 may display data stored in the memory device 513 through a display 530 according to an input signal generated by an input device 520. For example, the input device 520 may be embodied in a pointing device such as a touch pad or a computer mouse, a keypad or a keyboard.

Figure 11:
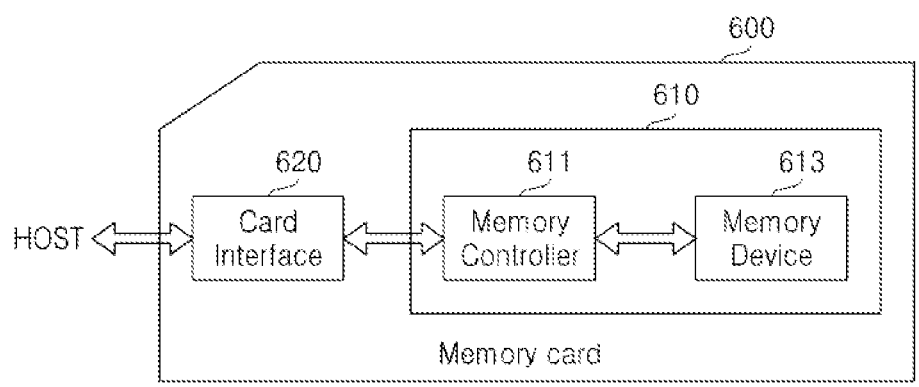
FIG. 11 depicts still another example embodiment of the system including the memory device illustrated in FIG. 1.

FIG. 11 is still another example embodiment of the system including the memory device illustrated in FIG. 1. Referring to FIGS. 1, 7, 8 and 11, a system 600 may be embodied in a memory card or a smart card.

The system 600 includes a memory device 613, a memory controller 611, and a card interface 610. The memory device 613 may include the memory device 100 illustrated in FIG. 1. According to an example embodiment, the memory device 613 and the memory controller 611 may be packaged into a package 610. The package 610 may be mounted on a system board (not shown). The package 610 may include the package 300 illustrated in FIG. 7 or the package 300' illustrated in FIG. 8, for example.

The memory controller 611 may control data exchange between the memory device 613 and a card interface 620. According to an example embodiment, the card interface 620 may be a secure digital (SD) card interface or a multi-media card (MMC) interface; however, it is not restricted thereto.

According to a protocol of a host, the card interface 620 may interface data exchange between the host and the memory controller 611.

When the system 600 is connected to a host such as a computer, a digital camera, a digital audio player, a cellular phone, console video game hardware or a digital set-top box, the host may transmit or receive data stored in the memory device 613 through the card interface 620 and the memory controller 611.

Figure 12:
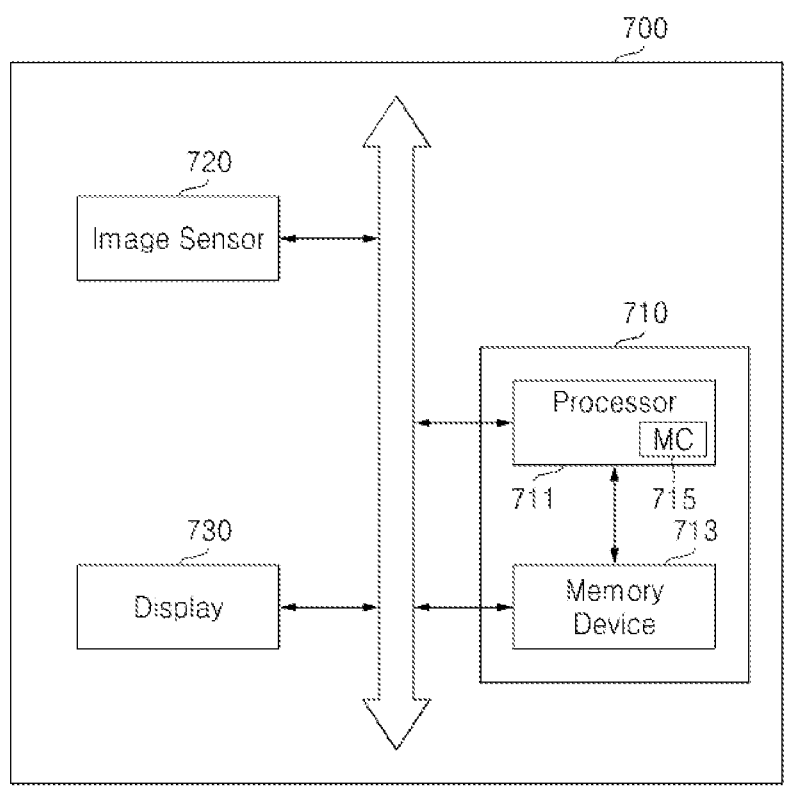
FIG. 12 depicts still another example embodiment of the system including the memory device illustrated in FIG. 1.

FIG. 12 is still another example embodiment of the system including the memory device illustrated in FIG. 1. Referring to FIGS. 1, 7, 8 and 12, a system 700 may be embodied in a digital camera or a digital camera-embedded portable device.

The system 700 includes a processor 711 controlling an overall operation of the system 700, and a memory device 713. Here, the memory device 713 may include the memory device 100 illustrated in FIG. 1. According to an example embodiment, the processor 711 and the memory device 713 may be packaged into a package 710. The package 710 may be mounted on a system board (not shown). The package 710 may be the package 300 of FIG. 7 or the package 300' of FIG. 8, for example.

An image sensor 720 of the system 700 converts an optical image into a digital signal, and a converted digital signal is stored in the memory device 713 or displayed through a display 730 under a control of the processor 711. In addition, a digital signal stored in the memory device 713 is displayed through the display 730 under a control of the processor 711.

Figure 13:
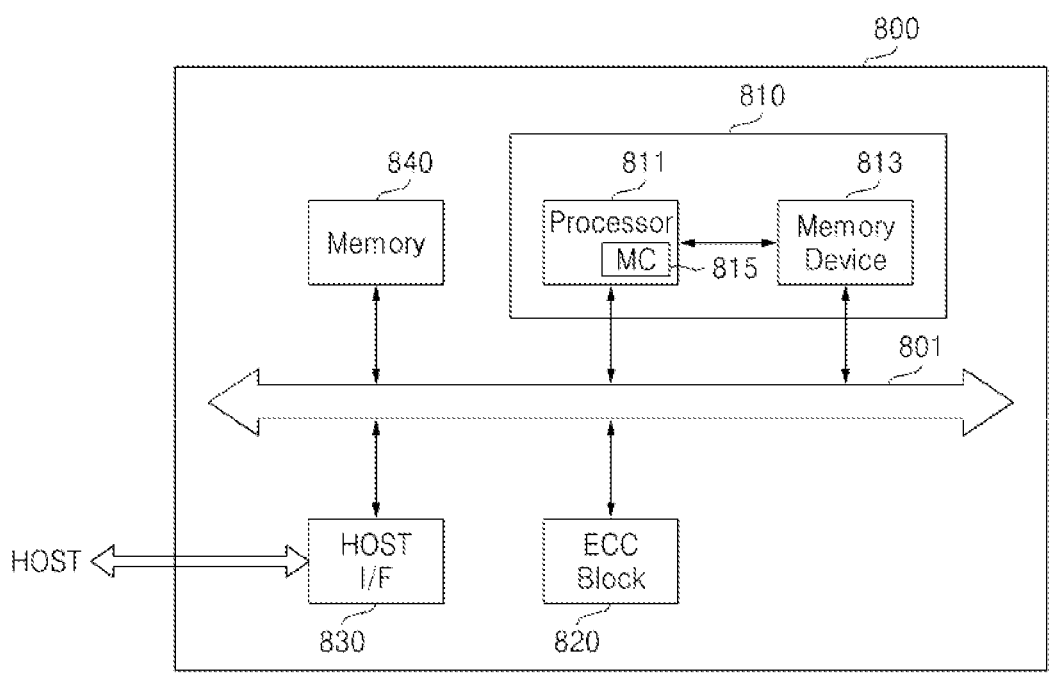
FIG. 13 depicts still another example embodiment of the system including the memory device illustrated in FIG. 1.

FIG. 13 is still another example embodiment of the system including the memory device illustrated in FIG. 1. Referring to FIGS. 1, 7, 8 and 13, a system 800 includes a memory device 813 and a processor 811 which may control an overall operation of the system 800. The memory device 813 may include the memory device 100 illustrated in FIG. 1.

According to an example embodiment, the memory device 813 and the processor 811 may be packaged into a package 810. The package 810 may be mounted on a system board (not shown). The package 810 may be the package 300 of FIG. 7 or the package 300' of FIG. 8, for example. The processor 811 includes a memory controller 815 for controlling an operation of the memory device 813.

The system 800 includes a memory 840 which may be used as an operation memory of the processor 811. The memory 840 may be embodied in a non-volatile memory such as a read only memory (ROM) or a flash memory. A host connected to the system 800 may transmit or receive data to/from the memory device 813 through the processor 811 and a host interface 830. Here, the memory controller 815 may perform a function of a memory interface.

According to an example embodiment, the system 800 may further include an error correction code (ECC) block 820. The ECC block 820 operating according to a control of the processor 811 may detect and correct an error included in data read from the memory device 813 through the memory controller 815. The processor 811 may control data exchange among the ECC block 820, the host interface 830 and the memory 840 through a bus 801.

The system 800 may be embodied, for example, in a Universal Serial Bus (USB) memory drive or a memory stick.

Figure 14:
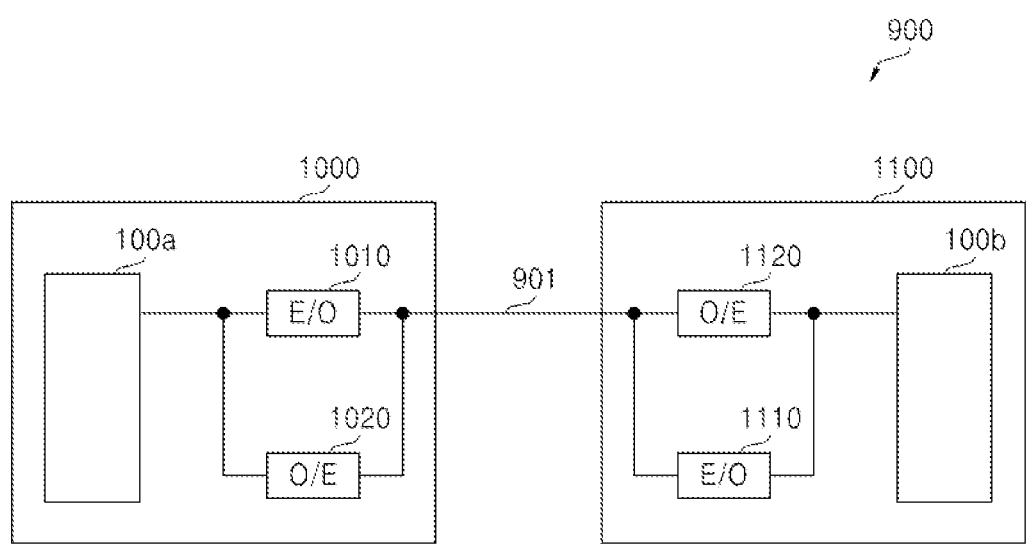
FIG. 14 depicts still another example embodiment of the system including the memory device illustrated in FIG. 1.

FIG. 14 is still another example embodiment of the system including the memory device illustrated in FIG. 1. A channel 901 may include an optical connection means. The optical connection means may be, for example, an optical fiber, an optical waveguide, or a medium transmitting an optical signal.

Referring to FIGS. 1 and 14, a system 900 may include a first system 1000 and a second system 1100. The first system 1000 may include a first memory device 100*a* and an electric-photo conversion circuit 1010. The electric-photo conversion circuit 1010 may convert an electrical signal output from the first memory device 100*a* into an optical signal and output a converted optical signal to the second system 1100 through an optical connection means 901. The second system 1100 includes a photo-electric conversion circuit 1120 and a second memory device 100*b*. The photo-electric conversion circuit 1120 may convert an optical signal input through the optical connection means 901 into an electric signal and transmit a converted electric signal to the second memory device 100*b*.

The first system 1000 may further include the photo-electric conversion circuit 1020, and the second system 1100 may further include the electric-photo conversion circuit 1110. When the second system 1100 transmits data to the first system 1000, the electric-photo conversion circuit 1110 may convert an electric signal output from the second memory device 100*b* into an optical signal, and output a converted optical signal to the first system 1000 through the optical connection means 901. The photo-electric conversion circuit 1020 may convert an optical signal input through the optical connection means 901 into an electric signal, and transmit a converted electric signal to the first memory device 100*a*. A structure and an operation of each memory device 100*a* and 100*b* are substantially the same as a structure and an operation of the memory device 100 of FIG. 1.

In addition, though two memory devices 100*a* and 100*b* are shown, one system (e.g., system 1100) may be another type of system. For example, system 1100 may be a controller system, such that controller signals are converted from electrical to optical signals, then sent to a memory using optical connection means 901, and then converted back to electrical signals for use by first memory device 100*a*.

Methods and an apparatuses according to an example embodiments described herein may include normal word lines with defective cells, wherein non-defective memory cells included in the normal word lines are used as is, by using a column address in repairing the normal word lines. In addition, exemplary methods and the apparatuses may improve efficiency of repair by repairing a plurality of normal word lines using a single redundant word line.

What is claimed is:

1. A method of repairing a word line of a memory device, comprising:
   receiving a row address and comparing the received row address with a row address of a defective cell;
   enabling a normal word line and a redundant word line, which correspond to the row address, according to a result of the row address comparison;
   receiving a column address and comparing the received column address with a column address of the defective cell; and
   performing a memory access operation on one of the normal word line and the redundant word line according to a result of the column address comparison.

2. The method of claim 1, further comprising:
   enabling the normal word line and the redundant word line, which correspond to the row address, when the row address comparison results in the received row address matching the row address of the defective cell.

3. The method of claim 1, wherein the performing the memory access operation includes,
   performing the memory access operation on the redundant word line when the received column address accords with the column address of the defective cell, and
   performing the memory access operation on the normal word line when the received column address does not accord with the column address of the defective cell.

4. The method of claim 1, wherein the redundant word line includes a plurality of redundant word line segments, and
   each of the plurality of redundant word line segments is used to repair a particular normal word line corresponding to the word line segment.

5. The method of claim 4, wherein:
   a first word line segment of the plurality of redundant word line segments is used to repair a set of defective cells of a first normal word line; and
   a second word line segment of the plurality of redundant word line segments is used to repair a set of defective cells of a second normal word line.

6. The method of claim 1, wherein comparing the received column address with the column address of the defective cell includes comparing the received column address with the column address of the defective cell included in the enabled normal word line corresponding to the received row address.

7. The method of claim 1, wherein the memory access operation is a read operation, and the performing the memory access operation includes,
   selecting one of the normal word line and the redundant word line when a sense amplifier enable signal for sensing and amplifying data output through a local data line corresponding to the column address is activated, and performing the memory access operation according to a result of selection.

8. The method of claim 1, wherein the memory access operation is a write operation, and the performing the memory access operation includes,
   selecting one of the normal word line and the redundant word line when a write MUX signal for transmitting data to a local data line corresponding to the column address is activated, and performing the memory access operation according to a result of selection.

9. A method of operating a memory device, the method comprising:
   receiving a row address and comparing the received row address with a row address of a defective memory cell;
   concurrently enabling a normal word line and a redundant word line for the normal word line based on the row address, when the received row address matches the row address of the defective memory cell;
   receiving a column address and comparing the received column address with a column address of the defective memory cell or a range of column addresses associated with the defective memory cell;
   selecting either the normal word line or the redundant word line according to a result of the column address comparison; and
   performing a memory access operation on the selected word line.

10. The method of claim 9, wherein the row address of the defective memory cell is stored in a one time programmable memory.

11. The method of claim 9, wherein comparing the received column address with the column address of the defective cell or the range of column addresses associated with the defective cell includes comparing the received column address with the column address of the defective cell, or the range of column addresses associated with the defective cell, included in the enabled normal word line corresponding to the received row address.

12. The method of claim 9, wherein performing the memory access operation includes,
   performing the memory access operation on the redundant word line when the received column address accords with the column address of the defective cell or range of column addresses associated with the defective cell, and
   performing the memory access operation on the normal word line when the received column address does not accord with either the column address of the defective cell or the range of column addresses associated with the defective cell.

13. The method of claim 9, wherein the redundant word line includes a plurality of redundant word line segments, and
   each word line segment of the plurality of redundant word line segments is used to repair a set of defective cells of particular normal word line corresponding to the word line segment.

14. The method of claim 13, wherein:
   a first word line segment of the plurality of redundant word line segments is used to repair a set of defective cells of a first normal word line; and
   a second word line segment of the plurality of redundant word line segments is used to repair a set of defective cells of a second normal word line.

15. A memory device, comprising:
   a memory cell array including a plurality of normal word lines and a plurality of redundant word lines;
   a row access circuit configured to receive a row address, compare the received row address with a row address of a defective cell, and enable both a normal word line corresponding to the row address from among the plurality of normal word lines and a redundant word line corresponding to the row address from among the plurality of redundant word lines;

a column address comparing circuit configured to receive a column address, compare the received column address with a column address of the defective cell, and generate a comparison signal according to a result of comparison; and a selection circuit configured to select one of the normal word line and the redundant word line to perform a memory access operation based on the comparison signal.

16. The memory device of claim 15, wherein the redundant word line is configured to repair at least two of the plurality of normal word lines.

17. The memory device of claim 15, wherein the redundant word line includes a plurality of redundant word line segments, and each of the plurality of redundant word line segments is configured to repair a particular normal word line corresponding to the redundant word line segment.

18. The memory device of claim 15, wherein the row access circuit includes a first one-time programmable (OTP) memory for storing the row address of the defective cell, and the column address comparing circuit includes a second OTP memory for storing the column address of the defective cell.

19. The memory device of claim 15, wherein the memory device is a dynamic random access memory (DRAM).

20. A memory system, comprising:

the memory device of claim 15; and a memory controller for generating the row address and the column address.

* * * * *